United States Patent

Nishimura et al.

(10) Patent No.: US 12,424,461 B2
(45) Date of Patent: Sep. 23, 2025

(54) SEPARATING SYSTEM AND SEPARATING METHOD

(71) Applicant: Tokyo Electron Limited, Tokyo (JP)

(72) Inventors: Satoshi Nishimura, Kumamoto (JP); Takeshi Tamura, Kumamoto (JP); Takashi Koga, Kumamoto (JP); Yohei Maeda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 101 days.

(21) Appl. No.: 18/060,715

(22) Filed: Dec. 1, 2022

(65) Prior Publication Data

US 2023/0178392 A1 Jun. 8, 2023

(30) Foreign Application Priority Data

Dec. 2, 2021 (JP) .................. 2021-195905

(51) Int. Cl.
*B32B 43/00* (2006.01)
*H01L 21/67* (2006.01)
*H01L 21/677* (2006.01)

(52) U.S. Cl.
CPC .. *H01L 21/67092* (2013.01); *H01L 21/67051* (2013.01); *H01L 21/67259* (2013.01); *H01L 21/67742* (2013.01); *B32B 43/006* (2013.01); *Y10T 156/1158* (2015.01); *Y10T 156/1917* (2015.01)

(58) Field of Classification Search
CPC ............. B32B 43/006; Y10T 156/1158; Y10T 156/1917
See application file for complete search history.

(56) References Cited

U.S. PATENT DOCUMENTS

2006/0130750 A1* 6/2006 Ishikawa ........... H01L 21/67754
118/663
2009/0027634 A1* 1/2009 Nishimura ........ H01L 21/67253
355/30

(Continued)

FOREIGN PATENT DOCUMENTS

JP 2003-163338 A 6/2003
JP 2021-012950 A 2/2021
WO WO-2021006092 A1 * 1/2021 ........... B32B 43/006

*Primary Examiner* — Philip C Tucker
*Assistant Examiner* — Nickolas R Harm
(74) *Attorney, Agent, or Firm* — Chrisman Gallo Tochtrop LLC

(57) ABSTRACT

A separating system includes a placing unit, a removing apparatus and a transfer device. The placing unit is configured to place therein a first cassette allowed to accommodate a combined substrate in which a first substrate and a second substrate are bonded to each other with a separation layer therebetween, a second cassette allowed to accommodate the first substrate, and a third cassette allowed to accommodate the second substrate. The removing apparatus is configured to remove the separation layer by radiating laser light to the combined substrate. The transfer device is configured to perform a processing of transferring the combined substrate to the removing apparatus and a processing of transferring the first substrate and the second substrate separated from the combined substrate to the placing unit.

10 Claims, 12 Drawing Sheets

(56) References Cited

U.S. PATENT DOCUMENTS

| | | | |
|---|---|---|---|
| 2009/0060686 A1* | 3/2009 | Morita | H01L 21/67109 414/222.12 |
| 2014/0076497 A1* | 3/2014 | Honda | H01L 21/304 156/701 |
| 2014/0120477 A1* | 5/2014 | Yasuda | H01L 21/67028 430/325 |
| 2016/0293467 A1* | 10/2016 | Caveney | H01L 21/67173 |
| 2018/0082881 A1* | 3/2018 | Nagakubo | H01L 21/6719 |
| 2019/0030651 A1* | 1/2019 | Sekiya | B23K 26/352 |
| 2020/0130106 A1* | 4/2020 | Iizuka | B23K 26/0093 |
| 2022/0020614 A1* | 1/2022 | Masuda | H01L 21/68707 |
| 2022/0270895 A1* | 8/2022 | Nakano | H01L 21/7806 |

* cited by examiner

SEPARATING SYSTEM AND SEPARATING METHOD

CROSS-REFERENCE TO RELATED APPLICATION

This application claims the benefit of Japanese Patent Application No. 2021-195905 filed on Dec. 2, 2021, the entire disclosure of which is incorporated herein by reference.

TECHNICAL FIELD

The various aspects and embodiments described herein pertain generally to a separating system and a separating method.

BACKGROUND

Conventionally, there is known a technique in which a separating target layer is separated from a substrate by using a physical force of a human hand or the like after forming a separation layer (first material layer) between the substrate and the separating target layer and removing a part of the separation layer by radiating laser light thereto.
Patent Document 1: Japanese Patent Laid-open Publication No. 2003-163338

SUMMARY

In one exemplary embodiment, a separating system includes a placing unit, a removing apparatus and a transfer device. The placing unit is configured to place therein a first cassette allowed to accommodate a combined substrate in which a first substrate and a second substrate are bonded to each other with a separation layer therebetween, a second cassette allowed to accommodate the first substrate, and a third cassette allowed to accommodate the second substrate. The removing apparatus is configured to remove the separation layer by radiating laser light to the combined substrate. The transfer device is configured to perform a processing of transferring the combined substrate to the removing apparatus and a processing of transferring the first substrate and the second substrate separated from the combined substrate to the placing unit.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
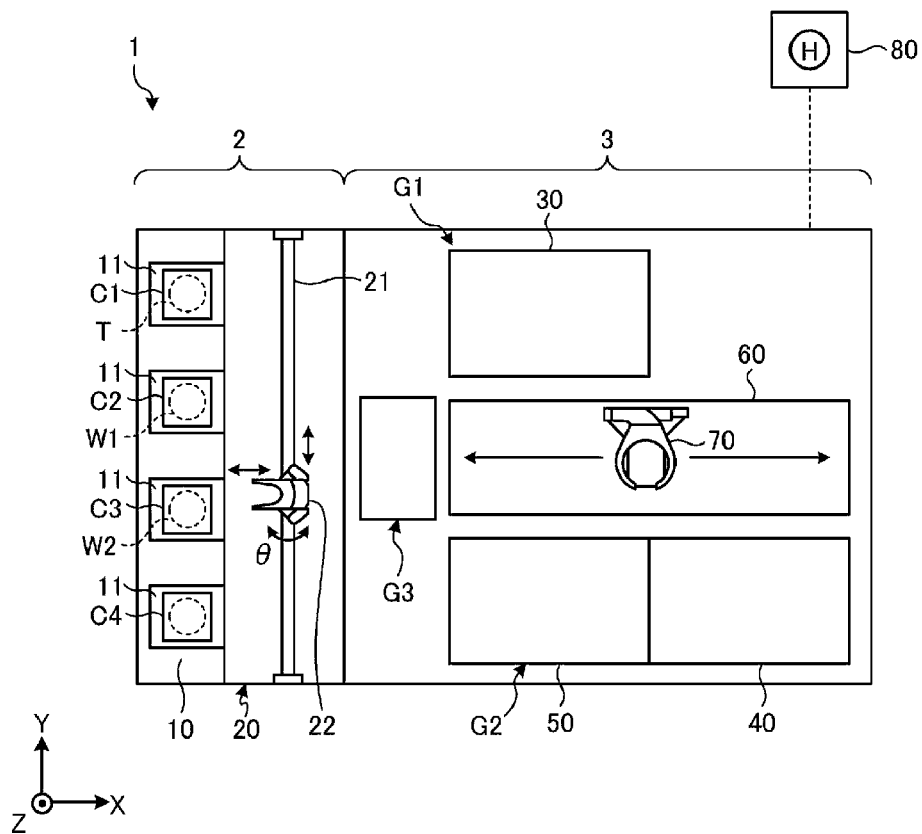
FIG. 1 is a schematic plan view illustrating a configuration of a separating system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a separating system and a separating method according to the present disclosure (hereinafter, referred to as "exemplary embodiments") will be described in detail with reference to the accompanying drawings. Further, it should be noted that the present disclosure is not limited by the exemplary embodiments. Further, unless processing contents are contradictory, the various exemplary embodiments and modification examples can be appropriately combined. Furthermore, in the various exemplary embodiments and modification examples to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as θ direction.

Further, it should be noted that the drawings are schematic and relations in sizes of individual components and ratios of the individual components may sometimes be different from actual values. Even between the drawings, there may exist parts having different dimensional relationships or different ratios.

<Overall Configuration of Separating System 1>

Figure 2:
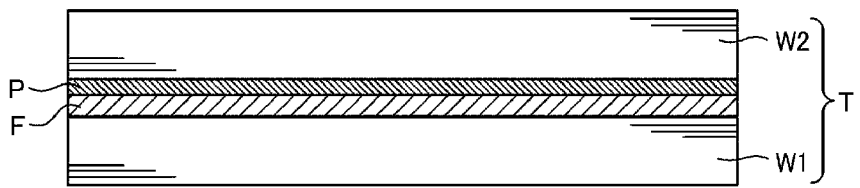
FIG. 2 is a schematic side view of a combined substrate according to the exemplary embodiment.

First, a configuration of a separating system 1 according to an exemplary embodiment will be described with reference to FIG. 1 and FIG. 2. FIG. 1 is a schematic plan view illustrating the configuration of the separating system 1 according to the exemplary embodiment. FIG. 2 is a schematic side view of a combined substrate according to the exemplary embodiment.

The separating system 1 shown in FIG. 1 separates a combined substrate T, which is composed of a first substrate W1 and a second substrate W2 bonded to each other, into the first substrate W1 and the second substrate W2.

The first substrate W1 is, for example, a semiconductor wafer such as a silicon substrate. The first substrate W1 has a surface film F. The surface film F is, for example, an adhesive. In addition, without being limited thereto, the surface film F may be a $SiO_2$ film, a TEOS film, a SiC film, a SiCN film, or the like. In addition, the first substrate W1 may have a device layer at an interface with the surface film F.

The second substrate W2 is also a semiconductor wafer such as, but not limited to, a silicon substrate. The second substrate W2 has a separation layer P. The separation layer P is positioned between the second substrate W2 and the surface film F. The separation layer P absorbs laser light radiated from a laser radiating unit 39 as will be described later. The separation layer P is, for example, a metal film or the like. Moreover, in order to increase transmittance of the laser light, the second substrate W2 may have such a film as, but not limited to, an antireflection film on both surfaces thereof. In this case, the separation layer P is formed on the film such as the antireflection film. In addition, the second substrate W2 may be a glass substrate, a TFT (Thin Film Transistor) substrate, or the like.

The first substrate W1 and the second substrate W2 are bonded to each other with the surface film F and the separation layer P therebetween.

As depicted in FIG. 1, the separating system 1 includes a carry-in/out station 2 and a processing station 3. The carry-in/out station 2 and the processing station 3 are arranged in the order of the carry-in/out station 2 and the processing station 3 along the positive X-axis direction. Further, the carry-in/out station 2 and the processing station 3 are connected as one body.

The carry-in/out station 2 includes a placing unit 10 and a transfer section 20. The placing unit 10 is equipped with a multiple number of placing plates 11. Respectively provided on the placing plates 11 are a first cassette C1, a second cassette C2, and a third cassette C3 each of which accommodates therein a plurality (e.g., 25 sheets) of substrates horizontally. The first cassette C1 accommodates therein the combined substrate T; the cassette C2, the first substrate W1; and the cassette C3, the second substrate W2. Moreover, a fourth cassette C4 for collecting a defective substrate may also be provided on the placing plate 11 in addition to the cassettes C1 to C3.

The transfer section 20 is provided adjacent to the positive X-axis side of the placing unit 10. Provided in this transfer section 20 are a transfer path 21 extending in the Y-axis direction and a first transfer device 22 configured to be movable along the transfer path 21.

The first transfer device 22 is configured to be movable in the X-axis direction as well as in the Y-axis direction and pivotable around the Z-axis. The first transfer device 22 serves to transfer the combined substrate T, the first substrate W1, and the second substrate W2 between the cassettes C1 to C3 placed on the placing plates 11 and a third processing block G3 of the processing station 3 to be described later.

The processing station 3 is provided with multiple processing blocks equipped with various apparatuses, for example, three processing blocks G1, G2 and G3. By way of example, the first processing block G1 is disposed on the rear side (positive Y-axis side of FIG. 1) of the processing station 3, and the second processing block G2 is provided on the front side (negative Y-axis side of FIG. 1) of the processing station 3. Further, the third processing block G3 is disposed on the carry-in/out station 2 side (negative X-axis side of FIG. 1) of the processing station 3.

A removing apparatus 30 is disposed in the first processing block G1. The removing apparatus 30 removes the separation layer P by radiating laser light toward the combined substrate T from above the combined substrate T. A configuration of the removing apparatus 30 will be described later.

A separating apparatus 40 and a cleaning apparatus 50 are disposed in the second processing block G2. While attracting and holding both surfaces of the combined substrate T, the separating apparatus 40 pulls the combined substrate T in a direction in which the first substrate W1 and the second substrate W2 are moved away from each other, allowing the combined substrate T to be separated into the first substrate W1 and the second substrate W2. A configuration of the separating apparatus 40 will be elaborated later.

The cleaning apparatus 50 cleans a surface of the first substrate W1 separated from the combined substrate T. The cleaning apparatus 50 may be configured to perform cleaning of the second substrate W2 as well as the cleaning of the first substrate W1. A configuration of the cleaning apparatus 50 will be elaborated later.

Transition devices (delivery units) for the combined substrate T, the first substrate W1 and the second substrate W2 are disposed in the third processing block G3 while being stacked in multi-levels.

A transfer region 60 is formed in an area surrounded by the first processing block G1, the second processing block G2, and the third processing block G3. In the transfer region 60, a second transfer device 70 is disposed. The second transfer device 70 has, for example, a transfer arm configured to be movable in a vertical direction and a horizontal direction and pivotable about a vertical axis.

This second transfer device 70 moves within the transfer region 60, and transfers the combined substrate T, the first substrate W1, and the second substrate W2 to preset apparatuses within the first processing block G1, the second processing block G2, and the third processing block G3 that are adjacent to the transfer region 60. A configuration of the second transfer device 70 will be elaborated later.

The separating system 1 is also equipped with a control device 80. The control device 80 controls an operation of the separating system 1. A configuration of the control device 80 will be described later.

The layout of the removing apparatus 30, the separating apparatus 40, and the cleaning apparatus 50 shown in FIG. 1 is just an example. For another example, the separating apparatus 40 may be disposed next to the removing apparatus 30. In addition, although the separating system 1 is equipped with one removing apparatus 30, one separating apparatus 40, and one cleaning apparatus 50 in the present exemplary embodiment, the separating system 1 is not limited thereto and may be equipped with a plurality of removing apparatuses 30, a plurality of separating apparatuses 40, and a plurality of cleaning apparatuses 50. By way of example, the separating system 1 may have a configuration in which the first processing block G1 is equipped with one removing apparatus 30, one separating apparatus 40, and one cleaning apparatus 50, and the second processing block G2 is also equipped with one removing apparatus 30, one separating apparatus 40, and one cleaning apparatus 50. In addition, the plurality of removing apparatuses 30, the plurality of separating apparatuses 40, and the plurality of cleaning apparatuses 50 may be stacked in multiple levels.

<Second Transfer Device 70>

Figure 3:
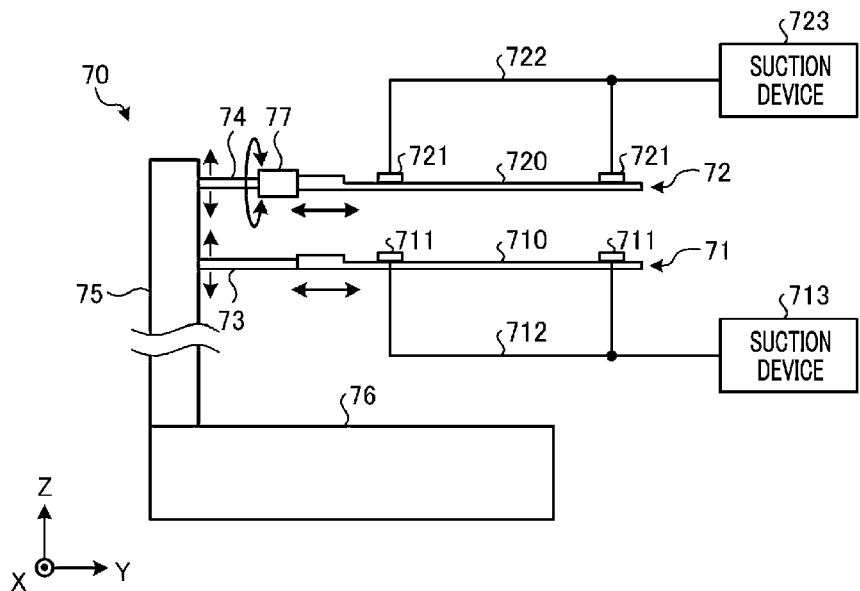
FIG. 3 is a schematic side view illustrating a configuration of a second transfer device according to the exemplary embodiment.

Now, the configuration of the second transfer device 70 will be described with reference to FIG. 3. FIG. 3 is a schematic side view illustrating the configuration of the second transfer device 70 according to the exemplary embodiment.

As depicted in FIG. 3, the second transfer device 70 is equipped with a first holder 71, a second holder 72, a first advancing and retreating mechanism 73, a second advancing and retreating mechanism 74, an elevating mechanism 75, and a horizontally moving mechanism 76. Also, the second transfer device 70 is further provided with an inverting mechanism 77.

The first holder 71 is configured to hold the first substrate W1. The second holder 72 is disposed above the first holder 71, and is configured to hold the second substrate W2. For example, the first holder 71 is equipped with a flat plate-shaped base 710 having a bifurcated shape and a plurality of attraction pads 711 provided on a surface of the base 710, and the second holder 72 is equipped with a flat plate-shaped base 720 having a bifurcated shape and a plurality of attraction pads 720 provided on a surface of the base 720.

The plurality of attraction pads 711 belonging to the first holder 71 are connected to a suction device 713 via a suction line 712. The suction device 713 is, by way of non-limiting example, a vacuum pump. The first holder 71 is capable of attracting the first substrate W1 to the attraction pads 711 by using a suction force generated by the suction device 713. Likewise, the plurality of attraction pads 721 belonging to the second holder 72 are connected to a suction device 723 via a suction line 722. The second holder 72 is capable of attracting the second substrate W2 to the attraction pad 721 by using a suction force generated by the suction device 723. In this way, the first holder 71 and the second holder 72 attract and hold the first substrate W1 and the second substrate W2 horizontally, respectively.

The first advancing and retreating mechanism 73 is configured to move the first holder 71 back and forth along a horizontal direction, specifically, along the Y-axis direction orthogonal to an extension direction of the transfer region 60. The second advancing and retreating mechanism 74 is configured to move the second holder 72 back and forth along the Y-axis direction.

The elevating mechanism 75 is configured to move the first holder 71 and the second holder 72 up and down by moving the first advancing and retreating mechanism 73 and the second advancing and retreating mechanism 74 along a vertical direction. The elevating mechanism 75 is capable of moving the first advancing and retreating mechanism 73 and the second advancing and retreating mechanism 74 up and down independently. Each of the first advancing and retreating mechanism 73, the second advancing and retreating mechanism 74, and the elevating mechanism 75 may be configured by, for example, a horizontal multi-joint robot. The horizontally moving mechanism 76 is configured to move the elevating mechanism 75 along the X-axis direction to move the first holder 71 and the second holder 72 horizontally in the extension direction of the transfer region 60 (X-axis direction). The inverting mechanism 77 inverts the second holder 72.

<Removing Apparatus 30>

Figure 4:
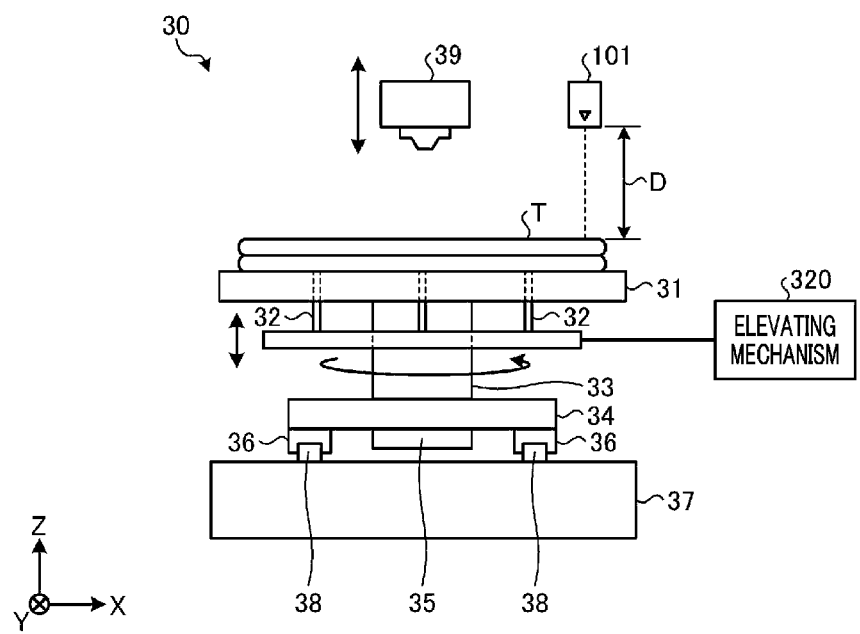
FIG. 4 is a schematic side view illustrating a configuration of a removing apparatus according to the exemplary embodiment.

Now, the configuration of the removing apparatus 30 will be explained with reference to FIG. 4. FIG. 4 is a schematic side view illustrating the configuration of the removing apparatus 30 according to the exemplary embodiment.

As illustrated in FIG. 4, the removing apparatus 30 includes a chuck 31 configured to attract and hold the combined substrate T on a top surface thereof. The chuck 31 is configured to attract and hold the entire bottom surface (the surface on the first substrate W1 side) of the combined substrate T. Alternatively, the chuck 31 may be configured to attract and hold a part of the bottom surface of the combined substrate T. The chuck 31 is provided with a plurality of elevating pins 32 for moving the combined substrate T up and down while supporting it from below. The plurality of elevating pins 32 are inserted through through holes (not shown) formed through the chuck 31, and are configured to be movable up and down by an elevating mechanism 320.

The chuck 31 is supported by a slider table 34 with an air bearing 33 therebetween. A rotating mechanism 35 is provided on the bottom surface side of the slider table 34. The rotating mechanism 35 incorporates therein, for example, a motor as a drive source. The chuck 31 is configured to be rotated about a θ-axis (vertical axis) by the rotating mechanism 35 via the air bearing 33. The slider table 34 is configured to be moved along a rail 38, which is provided on the base 37 and elongated in the Y-axis direction, by a moving mechanisms 36 provided on the lower surface side of the slider table 34. Although a drive source of the moving mechanism 36 is not specifically limited, it may be a linear motor, for example.

Further, the removing apparatus 30 is equipped with the laser radiating unit 39. The laser radiating unit 39 is disposed above the chuck 31, and is configured to radiate laser light toward the top surface of the chuck 31, that is, toward the top surface of the combined substrate T attracted to and held by the chuck 31.

The laser light is, for example, infrared laser light. Alternatively, the laser light may be $CO_2$ laser light. The laser light emitted from the laser radiating unit 39 penetrates the second substrate W2 to be radiated to the separation layer P. Further, the laser radiating unit 39 is configured to be movable up and down by an elevating mechanism (not shown). In addition, a light source of the laser light is provided at a distance position outside the laser radiating unit 39.

Here, an example of a removing processing by the removing apparatus 30 configured as described above will be explained. The combined substrate T is carried into the removing apparatus 30 by the second transfer device 70, and is disposed on the plurality of elevating pins 32 protruded from the top surface of the chuck 31.

The removing apparatus 30 lowers the plurality of elevating pins 32 by using the elevating mechanism 320, thus allowing the combined substrate T on the plurality of elevating pins 32 to be placed on the top surface of the chuck 31. Thereafter, the removing apparatus 30 attracts and holds the combined substrate T by using the chuck 31.

Subsequently, the removing apparatus 30 radiates the laser light from the laser radiating unit 39 toward the top surface of the combined substrate T in a pulse shape, for example. The laser light penetrates the second substrate W2 to be absorbed by the separation layer P. This laser light causes separating to occur at an interface between the separation layer P and the second substrate W2.

While radiating the laser light to the separation layer P, the removing apparatus 30 rotates the chuck 31 and the combined substrate T by the rotating mechanism 35, and, also, moves the chuck 31 in the Y-axis direction by the moving mechanism 36. The laser light is radiated to the separation layer P from a diametrically outer side toward a diametrical inner side thereof. As a result, the laser light is radiated in a spiral shape from an outer side toward an inner side. Alternatively, the removing apparatus 30 may control the rotating mechanism 35 and the moving mechanism 36 such that the laser light is radiated in a concentric circle shape instead of the spiral shape. In this case, the removing apparatus 30 needs to alternately perform a processing of rotating the chuck 31 one round by the rotating mechanism 35 and a processing of moving the chuck 31 horizontally by the moving mechanism 36. Further, although the chuck 31 is moved horizontally in the present exemplary embodiment, the removing apparatus 30 may be configured to horizontally move the laser radiating unit 39 instead. In this case, the removing apparatus 30 needs to be equipped with a moving mechanism configured to move the laser radiating unit 39 horizontally.

The separating system 1 has a detector 101. In the present exemplary embodiment, the detector 101 is a distance measurer. The detector 101 as the distance measurer is provided in the removing apparatus 30. Specifically, the detector 101 is disposed above the chuck 31, and is configured to measure a distance D from a reference position of the detector 101 to the top surface of the combined substrate T. In the separating system 1 according to the exemplary embodiment, based on the detection result of this detector 101, it is determined in the removing processing by the removing apparatus 30 whether or not the combined substrate T has been separated into the first substrate W1 and the second substrate W2.

<Separating Apparatus 40>

Figure 5:
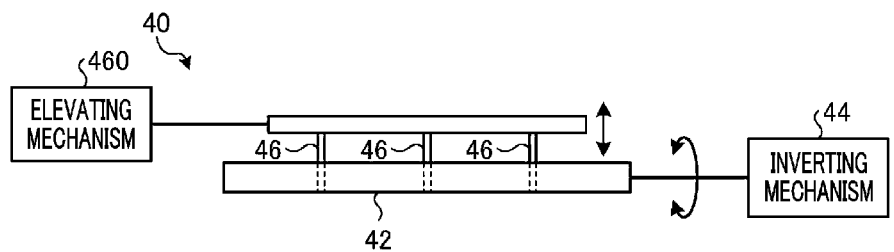
FIG. 5 is a schematic side view illustrating a configuration of a separating apparatus according to the exemplary embodiment.
Figure 5:
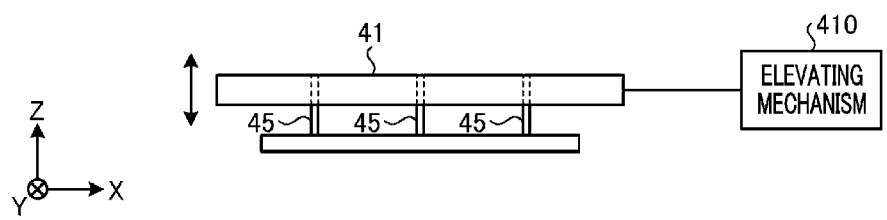

Now, the configuration of the separating apparatus 40 will be described with reference to FIG. 5. FIG. 5 is a schematic side view illustrating the configuration of the separating apparatus 40 according to the exemplary embodiment.

As depicted in FIG. 5, the separating apparatus 40 is equipped with a first attracting unit 41, a second attracting unit 42, and an inverting mechanism 44.

The first attracting unit 41 is configured to attract and hold the combined substrate T on a top surface thereof. The first attracting unit 41 attracts and holds the entire bottom surface (the surface on the first substrate W1 side) of the combined substrate T. The first attracting unit 41 is provided with a plurality of elevating pins 45. These elevating pins 45 are inserted through through holes (not shown) formed through the first attracting unit 41, and are configured to be movable up and down by an elevating mechanism 410.

The second attracting unit 42 is disposed above the first attracting unit 41, and serves to attract and hold the combined substrate T. The second attracting unit 42 is configured to attract and hold the entire top surface (the surface on the second substrate W2 side) of the combined substrate T. The second attracting unit 42 is provided with a plurality of elevating pins 46. These elevating pins 46 are inserted through through holes (not shown) formed through the second attracting unit 42, and are configured to be movable up and down by an elevating mechanism 460. The inverting mechanism 44 is configured to invert the second attracting unit 42 and the elevating pins 46 together.

Here, an operation example of a separating processing by the separating apparatus 40 will be discussed with reference to FIG. 6 to FIG. 11. FIG. 6 to FIG. 11 are diagrams showing the operation example of the separating processing by the separating apparatus 40.

Figure 6:
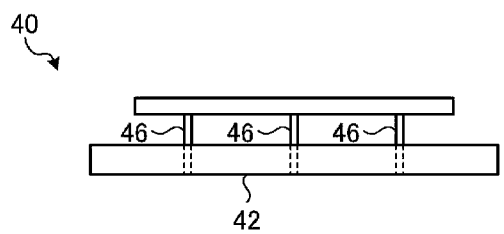
FIG. 6 is a diagram illustrating an operation example of a separating processing by the separating apparatus.
Figure 6:
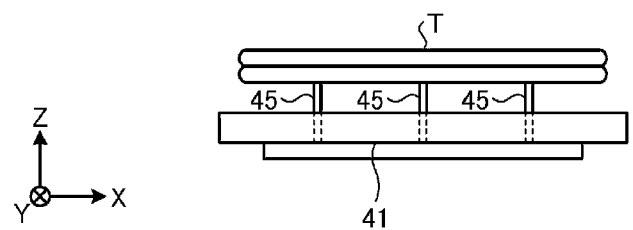

The combined substrate T is carried into the separating apparatus 40 by the second transfer device 70, and is disposed on the plurality of elevating pins 45 protruded from the top surface of the first attracting unit 41 (see FIG. 6).

Figure 7:
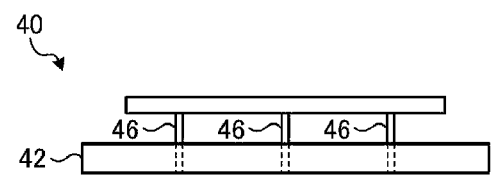
FIG. 7 is a diagram illustrating an operation example of the separating processing by the separating apparatus.
Figure 7:
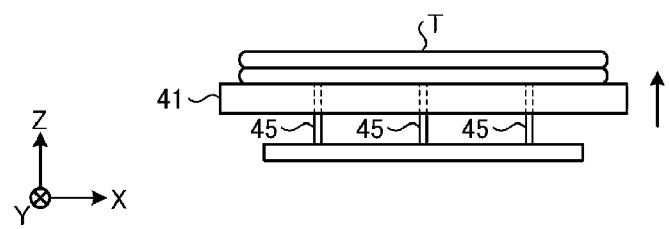

Next, the separating apparatus 40 moves the first attracting unit 41 upwards by using the elevating mechanism 410, thus allowing the combined substrate T disposed on the plurality of elevating pins 45 to be placed on the top surface of the first attracting unit 41 (see FIG. 7). Then, the separating apparatus 40 attracts and holds the combined substrate T by using the first attracting unit 41.

Figure 8:
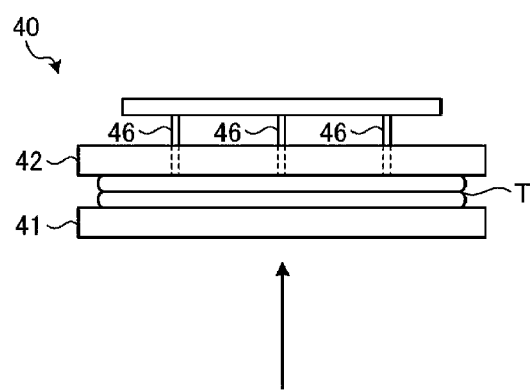
FIG. 8 is a diagram illustrating an operation example of the separating processing by the separating apparatus.
Figure 8:
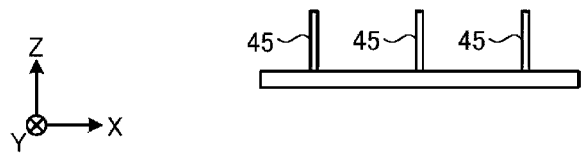
Figure 9:
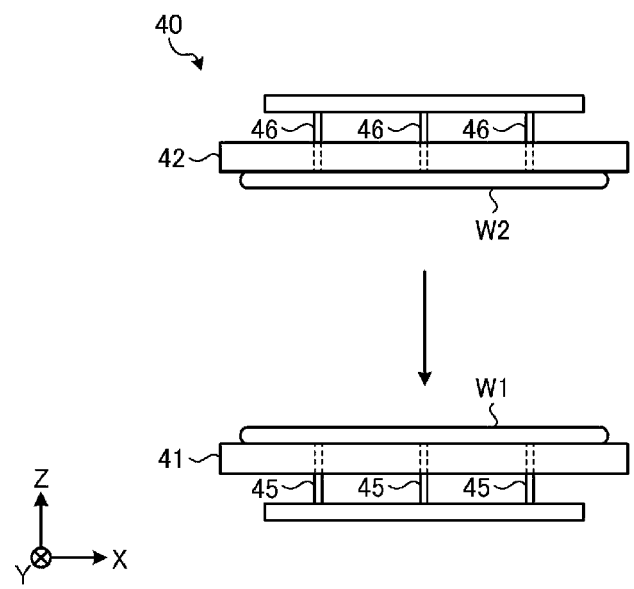
FIG. 9 is a diagram illustrating an operation example of the separating processing by the separating apparatus.

Thereafter, the separating apparatus 40 further raises the first attracting unit 41 so that the top surface of the combined substrate T is brought into contact with the bottom surface (attraction surface) of the second attracting unit 42 (see FIG. 8). Thereafter, the separating apparatus 40 attracts and holds the combined substrate T by using the second attracting unit 42.

Subsequently, while attracting and holding the top and bottom surfaces of the combined substrate T with the first attracting unit 41 and the second attracting unit 42, the separating apparatus 40 lowers the first attracting unit 41 by using the elevating mechanism 410. As a result, the combined substrate T is separated into the first substrate W1 and the second substrate W2 (see FIG. 9). The separating apparatus 40 then releases the attracting and holding of the first substrate W1 by the first attracting unit 41.

Figure 10:
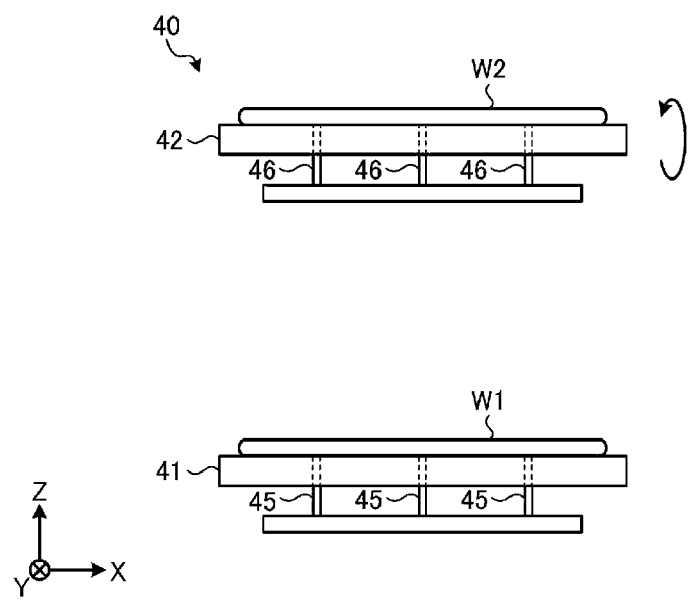
FIG. 10 is a diagram illustrating an operation example of the separating processing by the separating apparatus.

Thereafter, the separating apparatus 40 inverts the second attracting unit 42 and the plurality of elevating pins 46 by using the inverting mechanism 44 (see FIG. 10). Then, the separating apparatus 40 releases the attracting and holding of the second substrate W2 by the second attracting unit 42.

Figure 11:
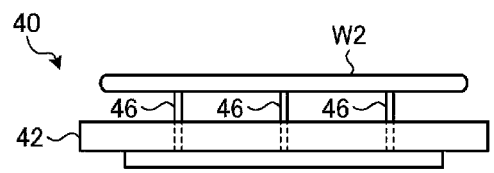
FIG. 11 is a diagram illustrating an operation example of the separating processing by the separating apparatus.
Figure 11:
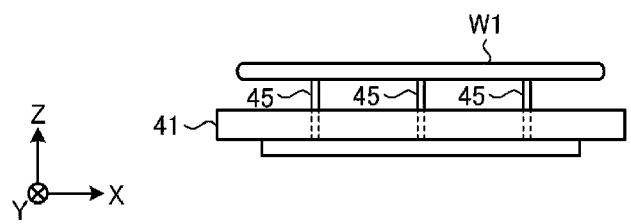

Next, the separating apparatus 40 lowers the first attracting unit 41, thus allowing the first substrate W1 to be transferred onto the plurality of elevating pins 45 (see FIG. 11). Further, the separating apparatus 40 raises the elevating pins 46, thus allowing the second substrate W2 to be transferred onto the plurality of elevating pins 46. Then, the first substrate W1 and the second substrate W2 are carried out from the separating apparatus 40 by the second transfer device 70. Moreover, the second transfer device 70 receives the first substrate W1 placed on the elevating pins 45 by lifting up the first substrate W1 from below with the first holder 71, and attracts and holds the received first substrate W1. Likewise, the second transfer device 70 receives the second substrate W2 placed on the elevating pins 46 by lifting up the second substrate W2 from below with the second holder 72, and attracts and holds the received second substrate W2. The second transfer device 70 may carry out the first substrate W1 and the second substrate W2 simultaneously, or may carry them out sequentially.

<Cleaning Apparatus 50>

Figure 12:
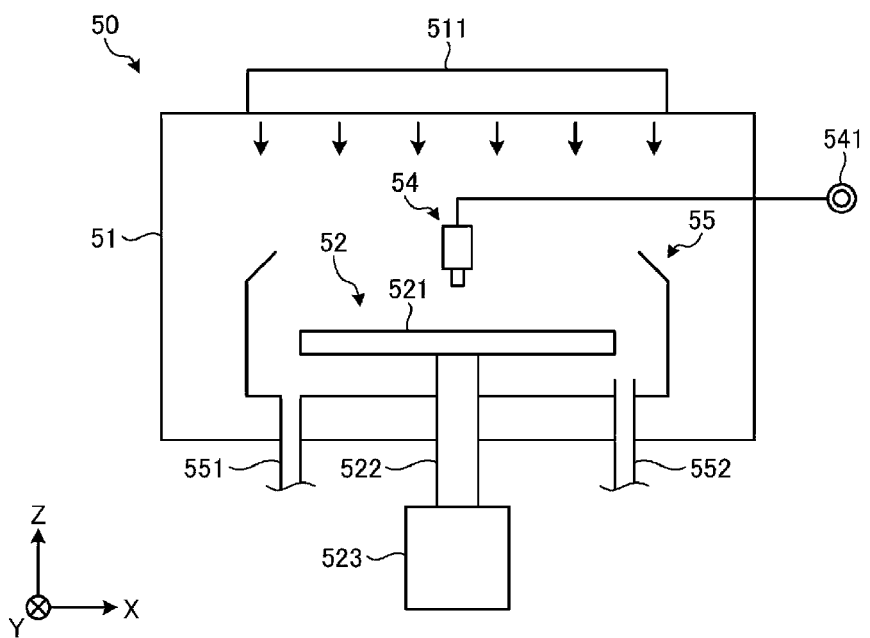
FIG. 12 is a schematic side view illustrating a configuration of a cleaning apparatus according to the exemplary embodiment.

Now, the configuration of the cleaning apparatus 50 will be described with reference to FIG. 12. FIG. 12 is a schematic side view illustrating the configuration of the cleaning apparatus 50.

As depicted in FIG. 12, the cleaning apparatus 50 includes a chamber 51, a substrate holding mechanism 52, a processing liquid supply 54, and a recovery cup 55.

The chamber 51 accommodates therein the substrate holding mechanism 52, the processing liquid supply 54 and the recovery cup 55. A FFU (Fan Filter Unit) 511 is provided at a ceiling of the chamber 51. The FFU 511 is configured to create a downflow within the chamber 51.

The substrate holding mechanism 52 is equipped with a holder 521, a supporting column 522, and a driver 523. The holder 521 is configured to hold the first substrate W1 or the second substrate W2 horizontally. The supporting column 522 is a vertically extending member, and a base end thereof is rotatably supported by the driver 523. The supporting column 522 supports the holder 521 horizontally on a leading end thereof. The driver 523 is configured to rotate the supporting column 522 around a vertical axis. This substrate holding mechanism 52 is configured to rotate the supporting column 522 by using the driver 523, thus allowing the holder 521 supported on the supporting column 522 to be rotated and, accordingly, the first substrate W1 or the second substrate W2 held by the holder 521 to be rotated.

The processing liquid supply 54 is configured to supply a cleaning liquid to the first substrate W1 or the second substrate W2. The processing liquid supply 54 is connected to a processing fluid source 541.

The recovery cup 55 is disposed to surround the holder 521, and collects the processing liquid scattered from the first substrate W1 or the second substrate W2 when the holder 521 is rotated. A drain port 551 is formed at a bottom of the recovery cup 55, and the cleaning liquid collected by the recovery cup 55 is drained from the drain port 551 to the outside of the cleaning apparatus 50. Further, an exhaust port 552 is also formed at the bottom of the recovery cup 55 to exhaust a gas supplied from the FFU 511 to the outside of the cleaning apparatus 50.

<Control Device 80>

Figure 13:
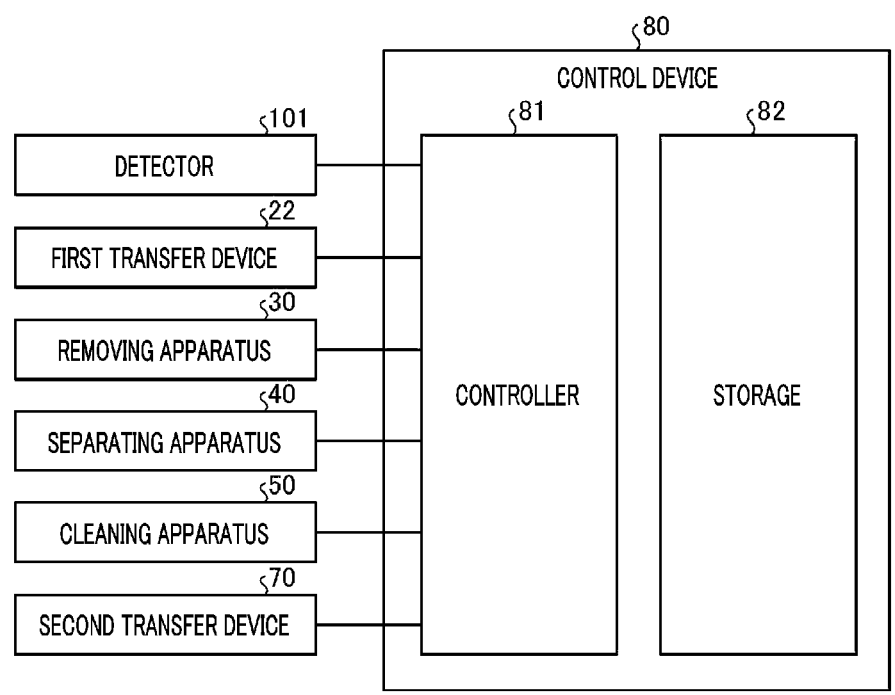
FIG. 13 is a block diagram illustrating a configuration of a control device according to the exemplary embodiment.

Now, the configuration of the control device 80 will be described with reference to FIG. 13. FIG. 13 is a block diagram illustrating the configuration of the control device 80 according to the exemplary embodiment.

As depicted in FIG. 13, the control device 80 is, for example, a computer, and includes a controller 81 and a storage 82. The storage 82 stores therein a program for controlling various processings such as the removing processing and the separating processing. The controller 81 controls the operation of the separating system 1 by reading and executing the program stored in the storage 82.

Further, the program may be recorded on a computer-readable recording medium, and installed from the recording medium to the storage 82 of the control device 80. The computer-readable recording medium may be a hard disk (HD), a flexible disk (FD), a compact disk (CD), a magnet optical disk (MO), a memory card, or the like.

The controller 81 is electrically connected with the detector 101, the first transfer device 22, the removing apparatus 30, the separating apparatus 40, the cleaning apparatus 50, the second transfer device 70, and so forth, and controls the operations of the first transfer device 22, the removing apparatus 30, the separating apparatus 40, the cleaning apparatus 50, the second transfer device 70, and so forth. In particular, the controller 81 according to the exemplary embodiment changes a transfer route of the substrate (the first substrate W1, the second substrate W2 or the combined substrate T) according to a detection result by the detector 101, that is, the measurement result of the distance D to the top surface of the combined substrate T in the removing apparatus 30.

Figure 14:
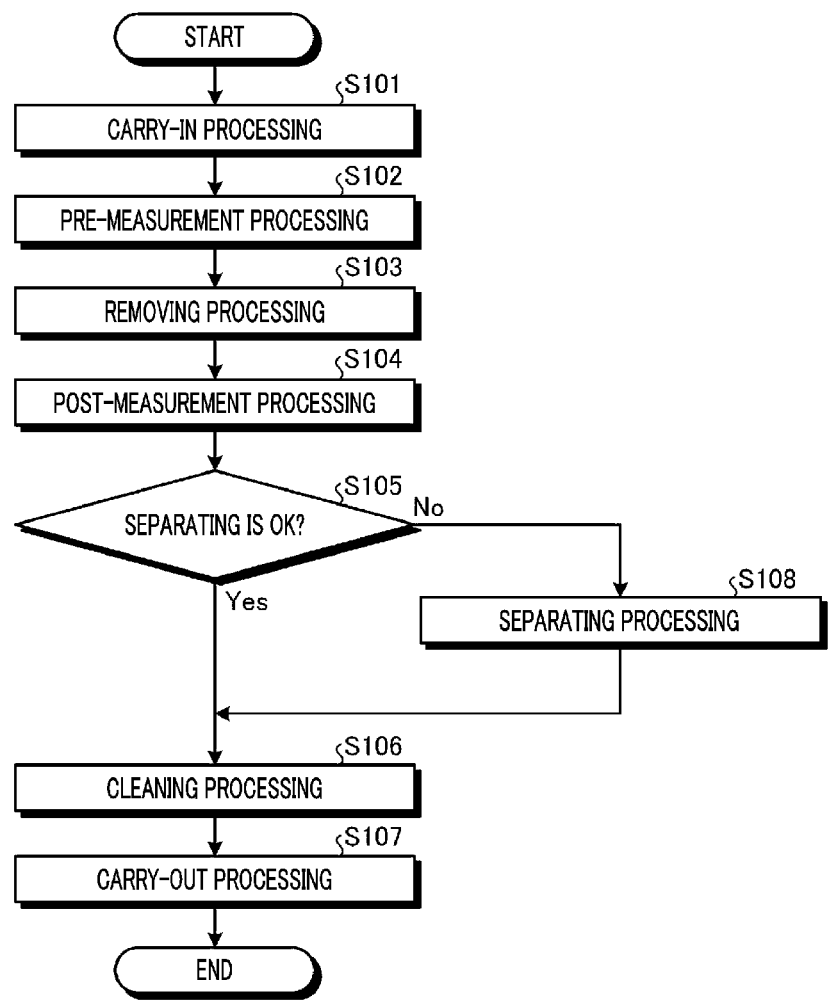
FIG. 14 is a flowchart illustrating a sequence of processings performed by the separating system according to the exemplary embodiment.

Now, a specific operation of the separating system 1 will be explained in connection with FIG. 14. FIG. 14 is a flowchart showing a sequence of processings performed by the separating system 1 according to the exemplary embodiment. A series of processings shown in FIG. 14 are performed under the control of the controller 81.

As illustrated in FIG. 14, in the separating system 1, a carry-in processing is first performed (process S101). In the carry-in processing, the first transfer device 22 takes out the combined substrate T from the first cassette C1, and places it in the transition device disposed in the third processing block G3. Then, the second transfer device 70 takes out the combined substrate T from the transition device, and carries it into the removing apparatus 30. The removing apparatus 30 lowers the plurality of elevating pins 32, thus allowing the combined substrate T disposed on the plurality of elevating pins 32 to be transferred onto the chuck 31. Then, the removing apparatus 30 attracts and holds the combined substrate T by using the chuck 31.

Subsequently, in the separating system 1, a pre-processing measurement processing is performed (process S102). In the pre-processing measurement processing, the distance D to the top surface of the combined substrate T is measured by using the detector 101.

Next, in the separating system 1, a removing processing is performed (process S103). As a result, the separation layer P is removed from the combined substrate T.

Then, in the separating system 1, a post-processing measurement processing is performed (process S104). In the post-processing measurement processing, the distance D to the top surface of the combined substrate T is measured again by using the detector 101.

Thereafter, the controller 81 determines whether or not the separating of the combined substrate T has been achieved by the removing processing (process S105). To elaborate, if the separating of the combined substrate T is achieved, that is, if the separation layer P is completely removed so that the combined substrate T is completely separated into the first substrate W1 and the second substrate W2, the distance D decreases as the second substrate W2 rises from the first substrate W1. Alternatively, the distance D may increase as the second substrate W2 sinks. In either case, when the separating of the combined substrate T is achieved, the distance D changes.

The controller 81 makes a determination that the separating of the combined substrate T has been achieved when an absolute value of a difference between a measurement result in the pre-processing measurement processing (the distance D before the removing processing) and a measurement result in the post-processing measurement processing (the distance D after the removing processing) exceeds a threshold.

When it is determined in the process S105 that the separating of the combined substrate T has been achieved (process S105, Yes), a cleaning processing is performed in the separating system 1 (process S106).

In the cleaning processing, the second transfer device 70 carries out the second substrate W2 from the removing apparatus 30 and carries it into the cleaning apparatus 50. Specifically, the second transfer device 70 attracts and holds the top surface of the second substrate W2 by using the second holder 72 in the state that the attraction pads 721 of the second holder 72 face down. Then, the second transfer device 70 raises the second holder 72 by using the elevating mechanism 75 to thereby lift up the second substrate W2, and, then, takes out the second substrate W2 from the removing apparatus 30. Subsequently, the second transfer device 70 inverts the second substrate W2 by inverting the second holder 72 with the inverting mechanism 77. Thereafter, the second transfer device 70 carries the second substrate W2 with its separating surface facing upwards into the cleaning apparatus 50. The cleaning apparatus 50 cleans the separating surface of the second substrate W2.

Moreover, the second transfer device 70 carries out the first substrate W1 and carries it into the cleaning apparatus 50. Specifically, after releasing the attracting and holding by the chuck 31, the removing apparatus 30 raises the plurality of elevating pins 32 by using the elevating mechanism 320. Thereafter, the second transfer device 70 receives the first substrate W1 as the first substrate W1 supported by the plurality of elevating pins 32 is lifted up from below, and carries the received first substrate W1 into the cleaning apparatus 50.

Here, although the exemplary embodiment has been described for the example where both the first substrate W1 and the second substrate W2 are cleaned by the cleaning apparatus 50, the separating system 1 does not necessarily need to clean the second substrate W2. When the cleaning of the second substrate W2 is not performed, the separating system 1 may omit the cleaning processing for the second substrate W2 and perform a carry-out processing to be described below.

Next, in the separating system 1, the carry-out processing of the first substrate W1 and the second substrate W2 is performed. In the carry-out processing, the second transfer device 70 takes out the first substrate W1 after being subjected to the cleaning processing from the cleaning apparatus 50, and places it in the transition device of the third processing block G3. Then, the first transfer device 22 takes out the first substrate W1 from the transition device and accommodates it in the second cassette C2. Likewise, the second transfer device 70 takes out the second substrate W2 after being subjected to the cleaning processing from the cleaning apparatus 50, and places it in the transition device of the third processing block G3. Thereafter, the first transfer device 22 takes out the second substrate W2 from the transition device and accommodates it in the third cassette C3. In case that the cleaning processing for the second substrate W2 is not performed, the second transfer device 70 takes out the second substrate W2 from the removing apparatus 30, and places it in the transition device of the third processing block G3.

Meanwhile, if it is determined in the process S105 that the separating of the combined substrate T has not been achieved (process S105, No), a separating processing is performed in the separating system 1 (process S108).

In the separating processing, the second transfer device 70 first takes out the combined substrate T from the removing apparatus 30, and carries it into the separating apparatus 40. Then, the separating apparatus 40 separates the combined substrate T into the first substrate W1 and the second substrate W2 by performing the aforementioned separating processing on the combined substrate T.

Afterwards, in the separating system 1, the cleaning processing (process S106) and the carry-out processing (process S107) are performed. To elaborate, the second transfer device 70 sequentially transfers the first substrate W1 and the second substrate W2 from the separating apparatus 40 to the cleaning apparatus 50, and the cleaning apparatus 50 performs the cleaning processing on the transferred first and second substrates W1 and W2 sequentially. In addition, the separating system 1 does not necessarily need to perform the cleaning processing for the second substrate W2.

Upon the completion of the carry-out processing of the process S107, the separating system 1 ends the series of processes of the separating processing.

A bonding state of the combined substrate T (for example, bonding strength or the thickness of the separation layer P) may differ between combined substrates T. Moreover, the state of the laser radiation in the removing processing may differ for each processing. Under such circumstances, the separating state of the combined substrate T after being subjected to the removing processing may be different between the combined substrates T. That is, some combined substrates T may be properly separated into the first substrate W1 and the second substrate W2 by the removing processing, while some others may not completely separated into the first substrate W1 and the second substrate W2 as the separation layer P is not completely removed.

Thus, in the separating system 1 according to the exemplary embodiment, it is determined based on the detection result by the detector 101 whether or not the separating of the combined substrate T has been achieved by the removing processing, and a processing to be performed next is determined based on the determination result. That is, in the separating system 1 if the separating of the combined substrate T has been achieved, the separated first and second substrates W1 and W2 are cleaned and carried out, whereas the separating processing by the separating apparatus 40 is performed on the combined substrate T which is not properly separated.

In this separating system 1, the separating processing is performed only on the combined substrate T which is not properly separated, and there is no case where the separating processing is performed on the combined substrate T which is properly separated. Therefore, according to the separating system 1 of the exemplary embodiment, efficiency of the series of processes of the separating processing can be achieved.

First Modification Example

Figure 15:
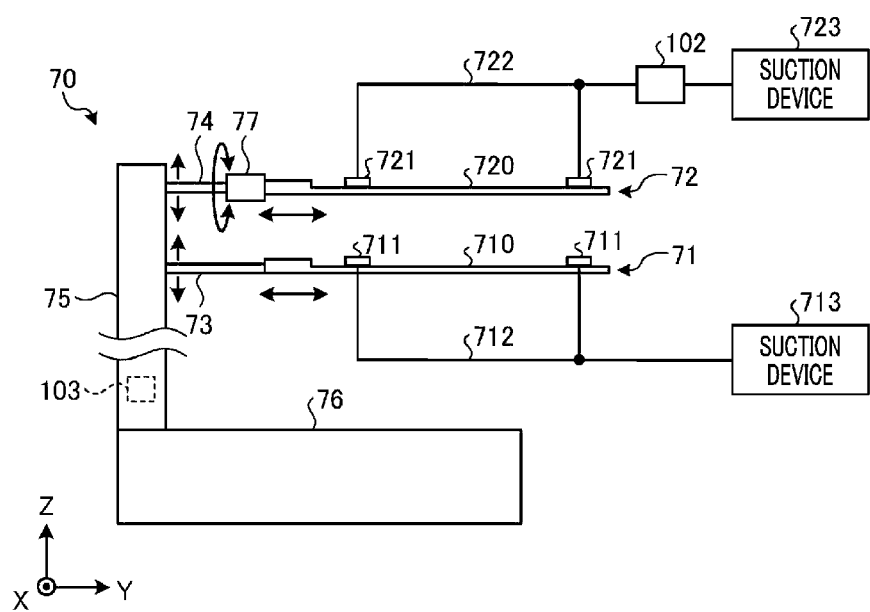
FIG. 15 is a diagram illustrating a configuration example of a detector according to a first modification example.
Figure 16:
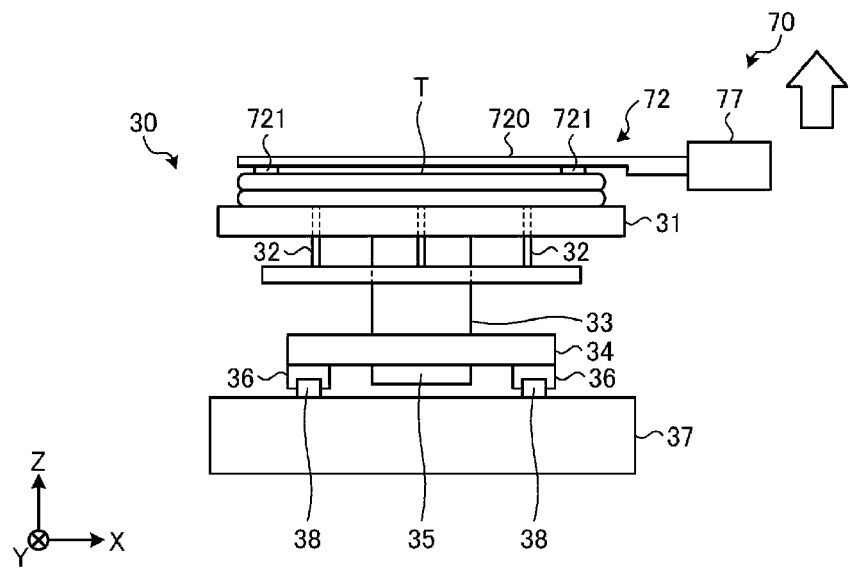
FIG. 16 is a diagram illustrating an operation example of a separating state determination processing according to the first modification example.
Figure 17:
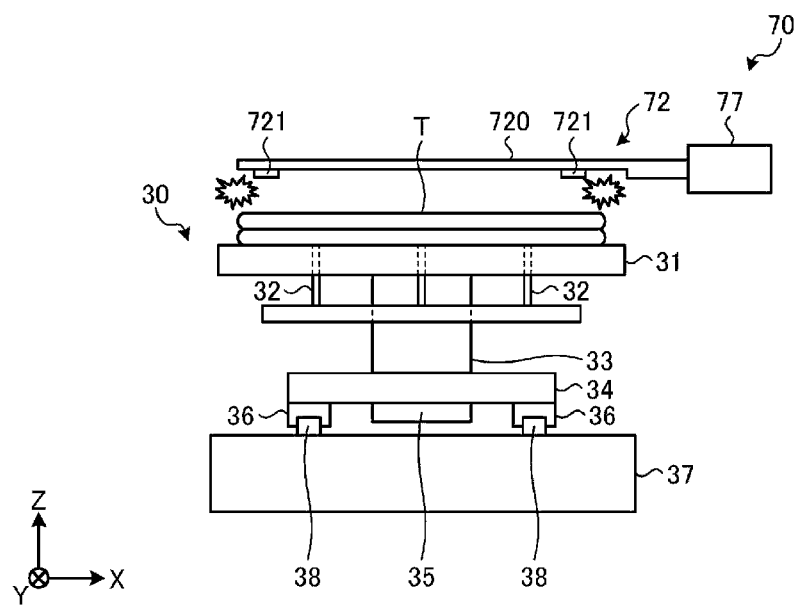
FIG. 17 is a diagram illustrating an operation example of the separating state determination processing according to the first modification example.

FIG. 15 is a diagram showing a configuration example of a detector according to a first modification example. FIG. 16 and FIG. 17 are diagrams showing an operation example of a separating state determination processing according to the first modification example.

The above exemplary embodiment has been described for the example where the detector 101 is the distance measurer configured to measure the distance D to the top surface of the combined substrate T disposed on the chuck 31 of the removing apparatus 30. However, the detector 101 is not limited to the distance measurer.

For example, as shown in FIG. 15, the separating system 1 may be equipped with a detector 103. The detector 103 is a load detector provided in the elevating mechanism 75 and configured to detect a load or a torque applied to the elevating mechanism 75. The detector 103 as the load detector is, by way of non-limiting example, a load cell or a torque sensor.

In addition, the separating system 1 may also be equipped with a detector 102. The detector 102 is a pressure detector configured to detect a suction pressure of the attraction pads 721 belonging to the second holder 72 of the second transfer device 70. The detector 102 as the pressure detector is provided at a midway position of the suction pipe 722, for example.

As shown in FIG. 16, after the removing processing is ended, the controller 81 makes the top surface of the combined substrate T attracted to and held by the second transfer device 70 by using the attraction pads 721 of the second holder 72. Then, the controller 81 raises the second holder 72 by using the elevating mechanism 75 of the second transfer device 70. The detector 103 as the load detector detects a load applied to the elevating mechanism 75 when the second holder 72 is raised.

The controller 81 determines whether the load detected by the detector 103 exceeds a threshold value. If the load detected by the detector 103 is found to be equal to or less than the threshold value, the controller 81 makes a determination that the separating of the combined substrate T has been achieved by the removing processing. On the other hand, if the load detected by the detector 103 is found to exceed the threshold value, the controller 81 makes a determination that the separating of the combined substrate T by the removing processing has not been achieved. In this case, the controller 81 performs the separating processing by the separating apparatus 40 on the combined substrate T.

The detector 102 as the pressure detector detects the suction pressure of the attraction pads 721 when the second holder 72 is raised. Here, if a bonding force between the first substrate W1 and the second substrate W2 is larger than the suction force of the attraction pads 721 when the separating of the combined substrate T is not achieved in the removing processing, the attraction pads 721 are detached from the top surface of the combined substrate T, as illustrated in FIG. 17. At this time, the suction pressure detected by the detector 102 rapidly decreases. Therefore, when the suction pressure detected by the detector 102 is equal to or less than the threshold value, the controller 81 makes a determination that the separating of the combined substrate T by the removing processing has not been achieved. In this case, the controller 81 performs the separating processing by the separating apparatus 40 on the combined substrate T. Meanwhile, when the suction pressure detected by the detector 102 exceeds the threshold value, the controller 81 makes a determination that the separating of the combined substrate T has been achieved by the removing processing.

In addition, although the separating system 1 is equipped with both the detector 102 and the detector 103 in the present example, the separating system 1 may have only one of the detector 102 and the detector 103.

Second Modification Example

Figure 18:
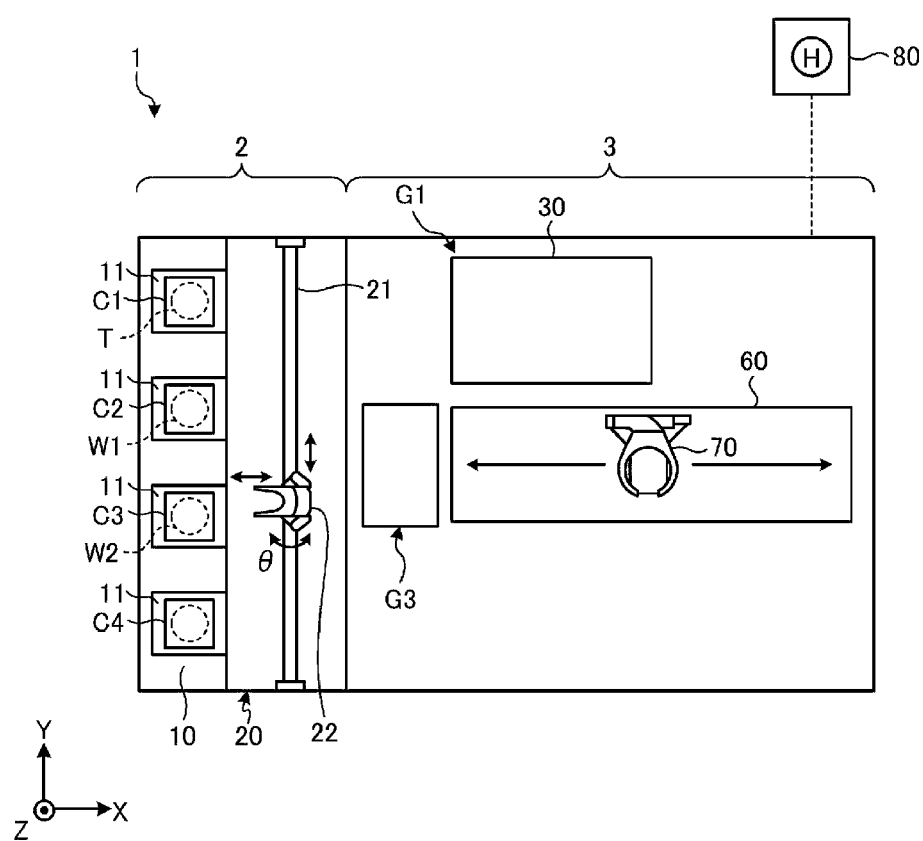
FIG. 18 is a schematic plan view illustrating a configuration of a separating system according to a second modification example.
Figure 19:
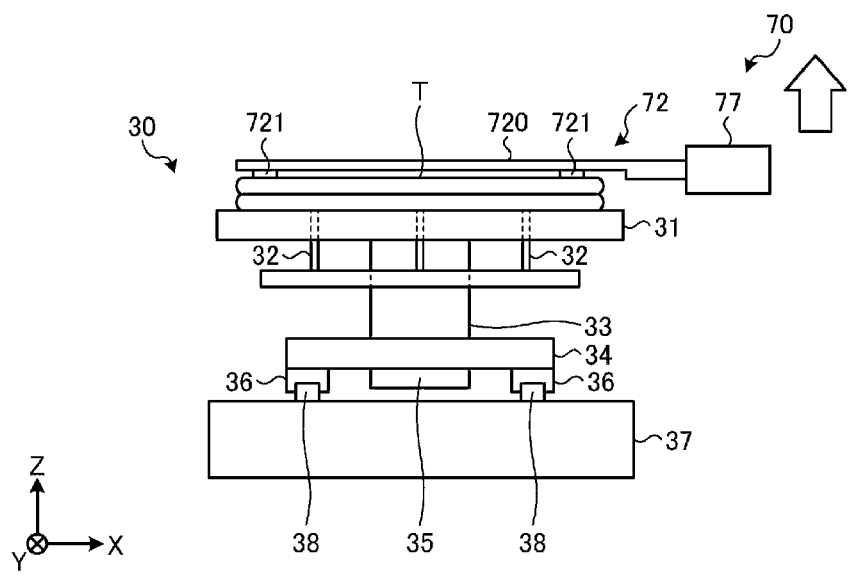
FIG. 19 is a diagram illustrating an operation example of a separating processing according to the second modification example.
Figure 20:
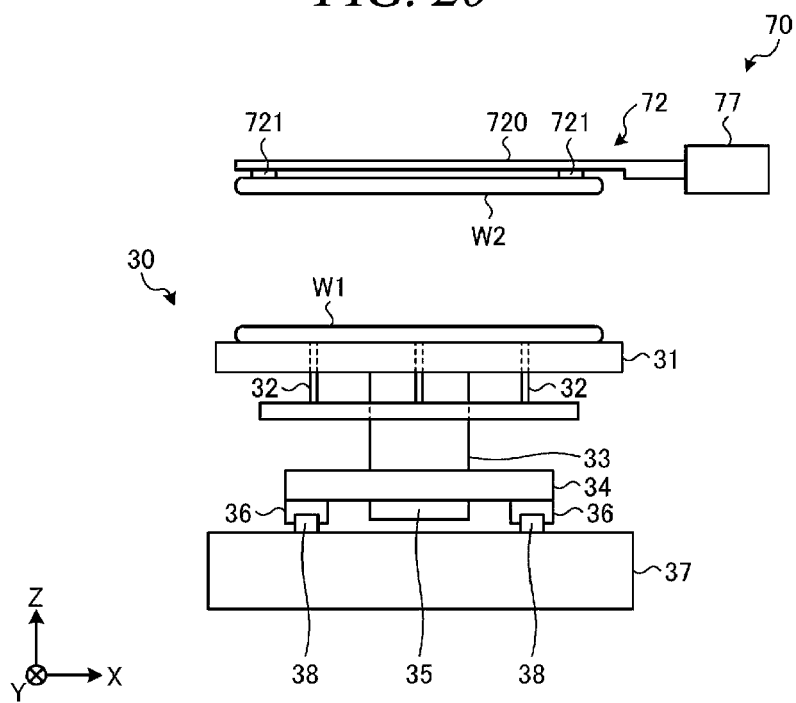
FIG. 20 is a diagram illustrating an operation example of the separating processing according to the second modification example.

FIG. 18 is a schematic plan view illustrating a configuration of the separating system 1 according to a second modification example. FIG. 19 and FIG. 20 are diagrams illustrating an operation example of a separating processing according to the second modification example.

The above exemplary embodiment has been described for the example where the separating system 1 is equipped with the separating apparatus 40 and the cleaning apparatus 50. However, the configuration of the separating system 1 is not limited to the above example.

By way of example, as shown in FIG. 18, the separating system 1 may not be equipped with the separating apparatus 40 and the cleaning apparatus 50. The separating system 1 may be equipped with the carry-in/out station 2, the third processing block G3 (transition devices), the removing apparatus 30, and the second transfer device 70 at least.

Assume that the controller 81 has made a determination that the separating of the combined substrate T by the removing processing has not been achieved based on the detection result by the detector 101 as the distance measurer, for example. In this case, after the completion of the removing processing, the controller 81 makes the top surface of the combined substrate T to attracted to and held by the second transfer device 70 by using the attraction pads 721 of the second holder 72 in the state that the combined substrate T is attracted to and held on the chuck 31, as illustrated in FIG. 19.

Thereafter, as depicted in FIG. 20, the controller 81 raises the second holder 72 by using the elevating mechanism 75 of the second transfer device 70, thus allowing the combined substrate T to be separated into the first substrate W1 and the second substrate W2. With this configuration, the combined substrate T which has not been properly separated by the removing processing can be separated into the first substrate W1 and the second substrate W2 without needing to provide an additional separating apparatus 40.

Other Modification Examples

In the above-described exemplary embodiment, it is determined whether or not the separating of the combined substrate T has been achieved in the removing apparatus 30, and the separating processing is performed only on the combined substrate T which is not properly separated. However, the present disclosure is not limited thereto, and the separating system 1 may perform the removing processing such that a part of the separation layer P is left intentionally in the removing apparatus 30, and, then, may perform the separating processing on the entire combined substrate T after being subjected to the removing processing by the separating apparatus 40. By way of example, the separating system 1 may leave a portion of the separation layer P located at the outer peripheral portion of the combined substrate T in the removing apparatus 30 while removing the rest part of the separation layers P. As another example, the separating system 1 may leave the separation layer P located at a central portion of the combined substrate T in the removing apparatus 30 while removing the rest part of the separation layers P.

Further, the separating system 1 may perform the separating processing by using the first holder 71 and the second holder 72 of the second transfer device 70. To elaborate, the second transfer device 70 attracts and holds the bottom surface of the combined substrate T by using the suction pads 711 of the first holder 71, and attracts and holds the top surface of the combined substrate T by using the suction pads 721 of the second holder 72. The controller 81 controls the first holder 71 and the second holder 72 to be distanced away from each other by using the elevating mechanism 75. For example, the controller 81 may lower the first holder 71 while maintaining the height of the second holder 72, or may raise the second holder 72 while maintaining the height of the first holder 71. In addition, the controller 81 may lower the first holder 71 and raise the second holder 72. Accordingly, the combined substrate T can be separated into the first substrate W1 and the second substrate W2.

As described above, a separating system (as an example, the separating system 1) according to the exemplary embodiment includes a placing unit (as an example, the placing unit 10), a removing apparatus (as an example, the removing apparatus 30), and a transfer device (as an example, the first transfer device 22 and the second transfer device 70). The placing unit is configured to place therein a first cassette (for example, the first cassette C1) allowed to accommodate therein a combined substrate (for example, the combined substrate T) in which a first substrate (for example, the first substrate W1) and a second substrate (as an example the second substrate W2) are bonded to each other with a separation layer (as an example, the separation layer P) therebetween, a second cassette (as an example, the second cassette C2) allowed to accommodate therein the first substrate, and a third cassette (as an example, the third cassette C3) allowed to accommodate therein the second substrate. The removing apparatus is configured to remove the separation layer by radiating laser light to the combined substrate. The transfer device is configured to perform a processing of transferring the combined substrate to the removing apparatus and a processing of transferring the first substrate and the second substrate separated from the combined substrate to the placing unit.

Therefore, according to the separating system of the exemplary embodiment, efficiency of a series processes of a separating processing can be improved.

The separating system according to the exemplary embodiment may be equipped with a detector (as an example, the detectors 101 to 103) configured to detect a separating state of the combined substrate in the removing apparatus; and a controller (as an example, the controller 81) configured to determine whether or not the combined substrate is separated into the first substrate and the second substrate based on a detection result by the detector. In this case, when it is determined that the combined substrate is separated into the first substrate and the second substrate, the controller may control the transfer device to take out the first substrate and the second substrate from the removing apparatus and transfer the taken first and second substrates to the placing unit. Therefore, a combined substrate which is not properly separated by the removing apparatus can be suppressed from being wrongly transferred to the placing unit.

The detector (as an example, the detector 101) may be disposed above the combined substrate in the removing apparatus, and may be configured to measure a distance to a top surface of the combined substrate. In this case, the controller may make a determination that the combined substrate is separated into the first substrate and the second substrate when an absolute value of a difference between the distance detected by the detector before a processing by the removing apparatus and the distance detected by the detector after the processing by the removing apparatus exceeds a threshold value. In this way, it can be determined whether or not the separating of the combined substrate is achieved by the removing apparatus.

The transfer device (as an example, the second transfer device 70) may be equipped with an attracting/holding unit (as an example, the second holder 72) configured to hold an object by suction; and an elevating mechanism (as an example, the elevating mechanism 75) configured to move the attracting/holding unit up and down. In this case, the detector (as an example, the detector 102) may detect a suction pressure of the attracting/holding unit. Further, the controller may make a determination that the combined substrate is separated into the first substrate and the second substrate when the suction pressure, which is detected by the detector when the controller controls the transfer device to raise the attracting/holding unit while holding and attracting the top surface of the combined substrate with the attracting/holding unit in the state that a bottom surface of the combined substrate is attracted to and held by the removing apparatus after a processing by the removing apparatus, exceeds a threshold value. Thus, it can be determined with a comparatively simple configuration whether or not the separating of the combined substrate by the removing apparatus is achieved.

The transfer device may be equipped with an attracting/holding unit configured to hold an object by suction; and an elevating mechanism configured to move the attracting/holding unit up and down. In this case, the detector (as an example, the detector 103) may detect a load or a torque applied to the elevating mechanism. Further, the controller may make a determination that the combined substrate is separated into the first substrate and the second substrate when the load or the torque, which is detected by the detector when the controller controls the transfer device to raise the attracting/holding unit while holding and attracting the top surface of the combined substrate with the attracting/holding unit in the state that the bottom surface of the combined substrate is attracted to and held by the removing apparatus after the processing by the removing apparatus, is equal or less than a threshold value. Therefore, it can be determined with a comparatively simple configuration whether or not the separating of the combined substrate by the removing apparatus is achieved.

The transfer device may be equipped with an inverting mechanism (as an example, the inverting mechanism 77) configured to invert the attracting/holding unit. Accordingly, the second substrate taken out from the removing apparatus while facing downwards can be inverted on the transfer device.

The separating system according to the exemplary embodiment may include a separating apparatus equipped with a first attracting unit (as an example, the first attracting unit 41) configured to attract the combined substrate from a first substrate side; a second attracting unit (as an example, the second attracting unit 42) configured to attract the combined substrate from a second substrate side; and an elevating mechanism (as an example, the elevating mechanism 410) configured to move a first one of the first attracting unit and the second attracting unit in a direction in which the first one of the first attracting unit and the second attracting unit is distanced away from a second one of the first attracting unit and the second attracting unit. In the state that the combined substrate is attracted by the first attracting unit and the second attracting unit, the separating apparatus moves the first one of the first attracting unit and the second attracting unit in the direction in which the first one of the first attracting unit and the second attracting unit is distanced away from the second one of the first attracting unit and the second attracting unit by the elevating mechanism, thus allowing the combined substrate to be separated into the first substrate and the second substrate. In this case, when it is determined that the combined substrate is not separated into the first substrate and the second substrate, the controller may control the transfer device to transfer the combined substrate from the removing apparatus to the separating apparatus, and control the separating apparatus to separate the combined substrate into the first substrate and the second substrate. Therefore, the combined substrate, which is not properly separated in the removing apparatus, can be certainly separated by the separating apparatus.

The separating system according to the exemplary embodiment may be equipped with a cleaning apparatus (for example, the cleaning apparatus 50) configured to clean at least one of the first substrate or the second substrates separated from the combined substrate. Accordingly, the separation layer remaining on a separating surface of the first substrate or the second substrate, for example, can be removed by the cleaning.

The transfer device may be equipped with an attracting/holding unit configured to attract and hold an object by suction; and an elevating mechanism configured to move the attracting/holding unit up and down. In this case, the controller may control the transfer device to raise the attracting/holding unit while holding and attracting the top surface of the combined substrate with the attracting/holding unit in the state that the bottom surface of the combined substrate is attracted to and held by the removing apparatus after the processing by the removing apparatus, thus allowing the combined substrate to be separated into the first substrate and the second substrate. Therefore, the combined substrate, which is not properly separated in the removing apparatus, can be separated without needing to additionally provide a dedicated apparatus for separating the combined substrate.

The exemplary embodiments disclosed herein are illustrative in all aspects and do not limit the present disclosure. The above-described exemplary embodiments may be omitted, replaced and modified in various ways without departing from the scope and the spirit of the appended claims.

According to the exemplary embodiment, it is possible to improve the efficiency of the series of processes of the separating processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A separating system, comprising:
    a placing unit configured to place therein a first cassette allowed to accommodate a combined substrate in which a first substrate and a second substrate are bonded to each other with a separation layer therebetween, a second cassette allowed to accommodate the first substrate, and a third cassette allowed to accommodate the second substrate;
    a removing apparatus configured to remove the separation layer by radiating laser light to the separation layer and allowing the separation layer to absorb the laser light, to thereby separate the first substrate and the second substrate from the combined substrate;
    a transfer device configured to perform a processing of transferring the combined substrate to the removing apparatus and a processing of transferring the first substrate and the second substrate separated from the combined substrate to the placing unit;
    a detector disposed above the combined substrate in the removing apparatus, and configured to detect a separating state of the combined substrate in the removing apparatus by measuring a distance to a top surface of the combined substrate; and
    a controller configured to determine that the combined substrate is separated into the first substrate and the second substrate when an absolute value of a difference between the distance detected by the detector before a processing by the removing apparatus and the distance detected by the detector after the processing by the removing apparatus exceeds a threshold value.

2. The separating system of claim 1,
    wherein when it is determined that the combined substrate is separated into the first substrate and the second substrate, the controller controls the transfer device to take out the first substrate and the second substrate from the removing apparatus and transfer the taken first and second substrates to the placing unit.

3. The separating system of claim 2, further comprising:
    a separating apparatus comprising a first attracting unit configured to attract the combined substrate from a first substrate side; a second attracting unit configured to attract the combined substrate from a second substrate side; and an elevating mechanism configured to move a first one of the first attracting unit and the second attracting unit in a direction in which the first one of the first attracting unit and the second attracting unit is distanced away from a second one of the first attracting unit and the second attracting unit,
    wherein, in a state that the combined substrate is attracted by the first attracting unit and the second attracting unit, the separating apparatus moves, by the elevating mechanism, the first one of the first attracting unit and the second attracting unit in the direction in which the first one of the first attracting unit and the second attracting unit is distanced away from the second one of the first attracting unit and the second attracting unit, thus allowing the combined substrate to be separated into the first substrate and the second substrate, and
    when it is determined that the combined substrate is not separated into the first substrate and the second substrate, the controller controls the transfer device to transfer the combined substrate from the removing apparatus to the separating apparatus, and controls the separating apparatus to separate the combined substrate into the first substrate and the second substrate.

4. The separating system of claim 1,
    wherein the transfer device comprises:
    an attracting/holding unit configured to attract and hold an object by suction; and
    an elevating mechanism configured to move the attracting/holding unit up and down,
    wherein the detector detects a suction pressure of the attracting/holding unit, and
    the controller makes a determination that the combined substrate is separated into the first substrate and the second substrate when the suction pressure, which is detected by the detector when the controller controls the transfer device to raise the attracting/holding unit while holding and attracting a top surface of the combined substrate with the attracting/holding unit in a state that a bottom surface of the combined substrate is attracted to and held by the removing apparatus after a processing by the removing apparatus, exceeds a threshold value.

5. The separating system of claim 4,
wherein the transfer device further comprises an inverting mechanism configured to invert the attracting/holding unit.

6. The separating system of claim 1,
wherein the transfer device comprises:
an attracting/holding unit configured to attract and hold an object by suction; and
an elevating mechanism configured to move the attracting/holding unit up and down,
wherein the detector detects a load or a torque applied to the elevating mechanism, and
the controller makes a determination that the combined substrate is separated into the first substrate and the second substrate when the load or the torque, which is detected by the detector when the controller controls the transfer device to raise the attracting/holding unit while holding and attracting a top surface of the combined substrate with the attracting/holding unit in a state that a bottom surface of the combined substrate is attracted to and held by the removing apparatus after a processing by the removing apparatus, is equal or less than a threshold value.

7. The separating system of claim 1, further comprising:
a separating apparatus comprising a first attracting unit configured to attract the combined substrate from a first substrate side; a second attracting unit configured to attract the combined substrate from a second substrate side; and an elevating mechanism configured to move a first one of the first attracting unit and the second attracting unit in a direction in which the first one of the first attracting unit and the second attracting unit is distanced away from a second one of the first attracting unit and the second attracting unit,
wherein, in a state that the combined substrate is attracted by the first attracting unit and the second attracting unit, the separating apparatus moves, by the elevating mechanism, the first one of the first attracting unit and the second attracting unit in the direction in which the first one of the first attracting unit and the second attracting unit is distanced away from the second one of the first attracting unit and the second attracting unit, thus allowing the combined substrate to be separated into the first substrate and the second substrate.

8. The separating system of claim 1, further comprising:
a cleaning apparatus configured to clean at least one of the first substrate or the second substrate separated from the combined substrate.

9. The separating system of claim 1,
the controller is further configured to control the transfer device,
wherein the transfer device comprises:
an attracting/holding unit configured to attract and hold an object by suction; and
an elevating mechanism configured to move the attracting/holding unit up and down, and
the controller controls the transfer device to raise the attracting/holding unit while holding and attracting a top surface of the combined substrate with the attracting/holding unit in a state that a bottom surface of the combined substrate is attracted to and held by the removing apparatus after a processing by the removing apparatus, thus allowing the combined substrate to be separated into the first substrate and the second substrate.

10. A separating method, comprising:
placing a first cassette allowed to accommodate a combined substrate in which a first substrate and a second substrate are bonded to each other with a separation layer therebetween, a second cassette allowed to accommodate the first substrate, and a third cassette allowed to accommodate the second substrate in a placing unit configured to place therein the first cassette, the second cassette and the third cassette;
taking out, by using a transfer device, the combined substrate from the first cassette placed in the placing unit and transferring the taken combined substrate to a removing apparatus configured to remove the separation layer by radiating laser light to the separation layer and allowing the separation layer to absorb the laser light;
removing the separation layer from the combined substrate by using the removing apparatus, thereby separating the first substrate and the second substrate from the combined substrate;
detecting a separating state of the combined substrate in the removing apparatus by measuring a distance to a top surface of the combined substrate by using a detector disposed above the combined substrate in the removing apparatus,
determining that the combined substrate is separated into the first substrate and the second substrate when an absolute value of a difference between the distance detected by the detector before a processing by the removing apparatus and the distance detected by the detector after the processing by the removing apparatus exceeds a threshold value, and
accommodating, by using the transfer device, the first substrate and the second substrate separated from the combined substrate in the second cassette and the third cassette placed in the placing unit, respectively.

* * * * *